(12) United States Patent
Baek et al.

(10) Patent No.: US 9,129,675 B2
(45) Date of Patent: Sep. 8, 2015

(54) RESISTIVE MEMORY DEVICES AND METHODS OF OPERATING THE SAME

(71) Applicant: Samsung Electronics Co., Ltd., Suwon-si (KR)

(72) Inventors: Ingyu Baek, Seoul (KR); Yeong-Taek Lee, Seoul (KR); KyungMin Kim, Goyang-si (KR)

(73) Assignee: Samsung Electronics Co., Ltd. (KR)

( * ) Notice: Subject to any disclaimer, the term of this patent is extended or adjusted under 35 U.S.C. 154(b) by 79 days.

(21) Appl. No.: 14/027,337

(22) Filed: Sep. 16, 2013

(65) Prior Publication Data

US 2014/0104923 A1    Apr. 17, 2014

(30) Foreign Application Priority Data

Oct. 12, 2012  (KR) .................. 10-2012-0113273

(51) Int. Cl.
*G11C 11/00* (2006.01)
*G11C 13/00* (2006.01)

(52) U.S. Cl.
CPC .......... *G11C 13/0069* (2013.01); *G11C 13/004* (2013.01); *G11C 13/0007* (2013.01)

(58) Field of Classification Search
CPC .......... G11C 13/0069; G11C 13/0007; G11C 13/004
USPC .................. 365/148, 185.18, 185.25, 194
See application file for complete search history.

(56) References Cited

U.S. PATENT DOCUMENTS

| | | | |
|---|---|---|---|
| 7,463,546 B2 | 12/2008 | Fasoli et al. | |
| 7,843,716 B2 | 11/2010 | Kang et al. | |
| 7,885,121 B2 | 2/2011 | Takase | |
| 7,889,537 B2 * | 2/2011 | Edahiro et al. | 365/148 |
| 7,920,407 B2 | 4/2011 | Chen et al. | |
| 8,009,456 B2 * | 8/2011 | Shimomura et al. | 365/148 |
| 8,098,507 B2 | 1/2012 | Jung et al. | |
| 8,139,391 B2 | 3/2012 | Scheuerlein | |
| 8,144,500 B2 | 3/2012 | Kono | |
| 8,184,470 B2 | 5/2012 | Toda et al. | |
| 8,264,867 B2 * | 9/2012 | Kawaguchi et al. | 365/148 |
| 8,295,077 B2 * | 10/2012 | Murooka | 365/148 |
| 8,331,152 B2 | 12/2012 | Yoon et al. | |
| 8,441,836 B2 * | 5/2013 | Parkinson et al. | 365/148 |
| 8,687,406 B2 * | 4/2014 | Toda | 365/148 |
| 2010/0195372 A1 | 8/2010 | Toda | |
| 2013/0170280 A1 * | 7/2013 | Toda | 365/148 |
| 2013/0270509 A1 * | 10/2013 | Hwang et al. | 257/4 |
| 2014/0301131 A1 * | 10/2014 | Siau et al. | 365/148 |

FOREIGN PATENT DOCUMENTS

KR    1020120050870    5/2012

* cited by examiner

*Primary Examiner* — Viet Q Nguyen
(74) *Attorney, Agent, or Firm* — Myers Bigel Sibley & Sajovec

(57) ABSTRACT

Resistive memory driving methods are provided. The methods may include applying an operating voltage set according to a mode of operation to a selected word line among the plurality of word lines and a selected bit line among the plurality of bit lines within a line delay period.

17 Claims, 18 Drawing Sheets

4000

RESISTIVE MEMORY DEVICES AND METHODS OF OPERATING THE SAME

CROSS-REFERENCE TO RELATED APPLICATION

This U.S. non-provisional patent application claims priority under 35 U.S.C. §119 to Korean Patent Application No. 10-2012-0113273, filed on Oct. 12, 2012, in the Korean Intellectual Property Office, the disclosure of which is hereby incorporated by reference in its entirety.

FIELD

The present disclosure generally relates to the field of electronics, and more particularly semiconductor devices.

BACKGROUND

Resistive memory devices store data using changes in electrical resistance of memory cells. Resistive memory devices may have cross-point architectures without switching devices and may be used for mass storage devices.

SUMMARY

A resistive memory driving method may include applying an initial voltage to a plurality of word lines and a plurality of bit lines and setting the plurality of word lines and the plurality of bit lines to a floating state. The method may also include applying an operating voltage set according to a mode of operation to a selected word line among the plurality of word lines and a selected bit line among the plurality of bit lines within a line delay period.

In various embodiments, applying the initial voltage may include applying a voltage of a level of a ground voltage to the plurality of word lines and the plurality of bit lines.

In various embodiments, the line delay period may include a product of resistance values and capacitance values of the selected word line and the selected bit line.

According to various embodiments, the line delay period may include a time constant, which is a product of resistance and capacitance of unselected word lines among the plurality of word lines and unselected bit lines among the plurality of bit lines.

In various embodiments, applying the operating voltage set may include applying voltage pulses to the selected word line and the selected bit line. Each of the voltage pulses may have a width less than or equal to the line delay period.

According to various embodiments, applying the voltage pulses may include applying set pulses having set voltage levels for writing operation.

According to various embodiments, applying the voltage pulses may include applying reset pulses having reset voltage levels for writing operation.

In various embodiments, applying the voltage pulses may include applying read pulses having read voltage levels for reading operation.

According to various embodiments, widths of the read pulses may be greater than widths of the voltage pulses for writing operation.

According to various embodiments, applying the voltage pulses may include applying forming pulses having a forming voltage level set for forming operation.

A resistive memory device may include a memory cell array including word lines, bit lines and memory cells in respective ones of intersections of each of the word lines and each of the bit lines. The device may also include a control circuit configured to apply an initial voltage to the word lines and the bit lines and then to apply an operating voltage set according to a mode of operation to a selected word line among the word lines and a selected bit line among the bit lines within a line delay period while unselected word lines among the word lines and unselected bit lines among the bit lines being electrically floated.

According to various embodiments, the line delay period may include a time constant, which is a product of resistance and capacitance of one word line among the word lines and one bit line among the bit lines.

In various embodiments, the operating voltage set according to a mode of operation may include voltage pulses. Each of the voltage pulses may have a width less than or equal to the line delay period.

In various embodiments, the voltage pulses may include set pulses having set voltage levels, reset pulses having reset voltage levels, or read pulses having read voltage levels.

According to various embodiments, widths of the read pulses may be greater than widths of the set pulses or widths of the reset pulses.

A method of programming and reading a nonvolatile memory device may include applying a first voltage pulse to a selected word line and applying a second voltage pulse to a selected bit line to program or read a selected cell identified by the selected word line and selected bit line. Each of the first and second voltage pulses may have a duration equal to or less than a line delay period associated with the selected word line and selected bit line.

According to various embodiments, the line delay may be a time constant including a product of a resistance and a capacitance of the selected word line and a resistance and a capacitance of the selected bit line.

In various embodiments, the method may also include setting a plurality of word lines including the selected word line and a plurality of bit lines including the selected bit line to a floating state before applying the first and second voltage pulses and maintaining unselected word lines among the plurality of word lines and unselected bit lines among the plurality of bit lines in the floating state while applying the first and second voltage pulses.

In various embodiments, the method may further include applying a first initial voltage to the plurality of word lines and applying a second initial voltage to the plurality of bit lines before setting the plurality of word lines and the plurality of bit lines to the floating state.

According to various embodiments, the first voltage pulse may have an amplitude equal to that of the second voltage pulse and the first voltage pulse may have polarity opposite of that of the second voltage pulse.

DETAILED DESCRIPTION

Figure 1:
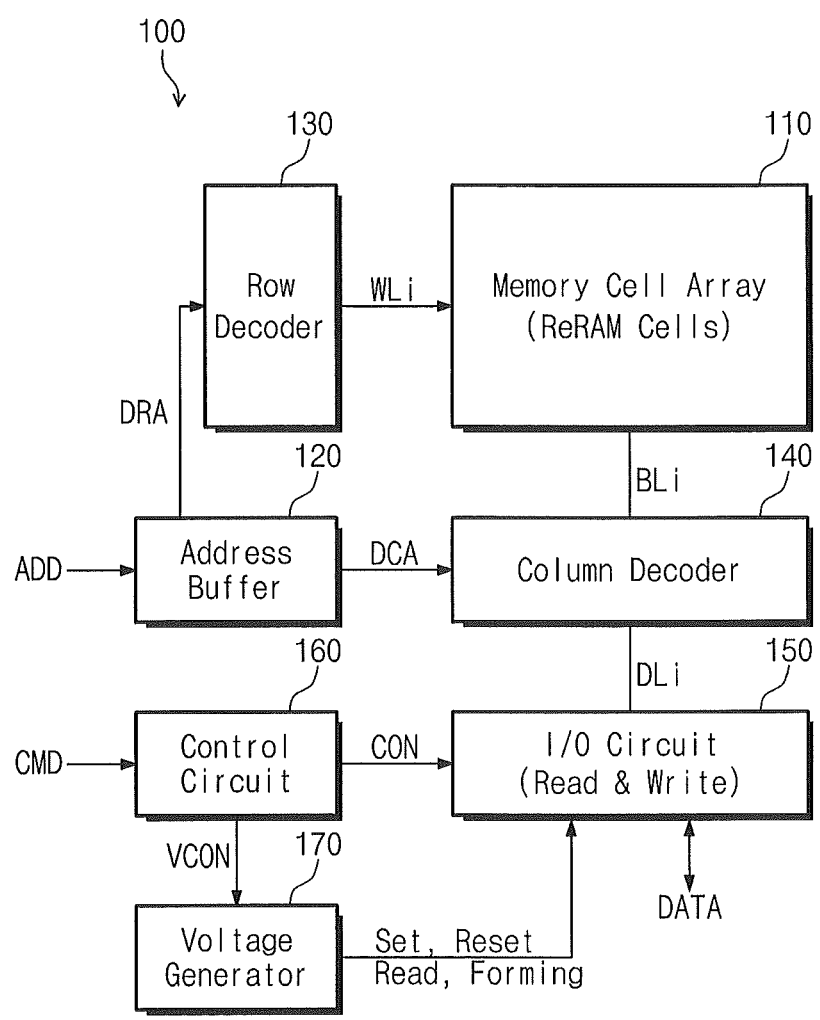
FIG. 1 is a block diagram illustrating a semiconductor memory device according to some embodiments of the present inventive concept.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element Or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a semiconductor memory device according to some embodiments of the present inventive concept. Referring to FIG. 1, a semiconductor memory device 100 may include a memory cell array 110 and a control circuit 160.

The memory cell array 110 may include resistive memory cells arranged in a matrix form of word lines and bit lines.

The control circuit 160 may apply an initial voltage (e.g., a ground voltage) to the word lines and the bit lines, and may apply an operating voltage set according to a mode of operation to a selected word line and a selected bit line within a line delay period of time after the word lines and the bit lines are set to a floating state.

The memory cell array 110 may be connected with a row decoder 130 through the word lines and with may be connected with a column decoder 140 through the bit lines. The row decoder 130 may decode a row address applied through an address buffer 120 to select (or, activate) a word line of the word lines. The column decoder 140 may decode a column address applied through the address buffer 120 to select a bit line of the bit lines.

A voltage generator 170 may generate operating voltage sets for Set, Reset, Read, and Forming operation according to modes of operation, based on a voltage control signal VCON of the control circuit 160.

An input/output circuit 150 may read data stored at a memory cell through a data line, and may store input write data at a memory cell. The input/output circuit 150 may include a read and write circuit unit.

Under the control of the control circuit 160, an initial voltage, for example, a ground voltage GND may be applied to selected and unselected word lines and selected and unselected bit lines of the memory cell array 110. The selected and unselected word lines and the selected and unselected bit lines may be floated under the control of the control circuit 160. An operating voltage set according to each mode of operation may be applied to the selected word line and the selected bit line within the line delay period of time under the control of the control circuit 160 while maintaining the above-described floating state (hereinafter, referred to as a floating maintenance state).

Herein, the line delay period of time may be a time constant decided according to resistance and capacitance values of the word line and the bit line. Since a selected or unselected word line and a selected or unselected bit line have parasitic resistance and capacitance, a pulse having a width (or duration) equal to or less than the time constant may be applied as an operating voltage. If the operating voltage is applied to a selected word line and a selected bit line as a pulse at the floating maintenance state, peripheral cells of a selected memory cell may be influenced by a line delay corresponding to an RC time constant. On the other hand, the selected memory cell may be influenced by the applied pulse voltage regardless of the line delay.

A leakage current flowing through peripheral memory cells other than a selected memory cell may be reduced by using as an operating voltage a pulse having a width (or duration) equal to or less an RC time constant of lines connected with memory cells. Thus, it is possible to reduce interference causing an abnormal operation.

A conventional biasing method is described herein to explain the present inventive concept. Also, generation of a leakage current associated with the biasing method is described herein.

Figure 2:
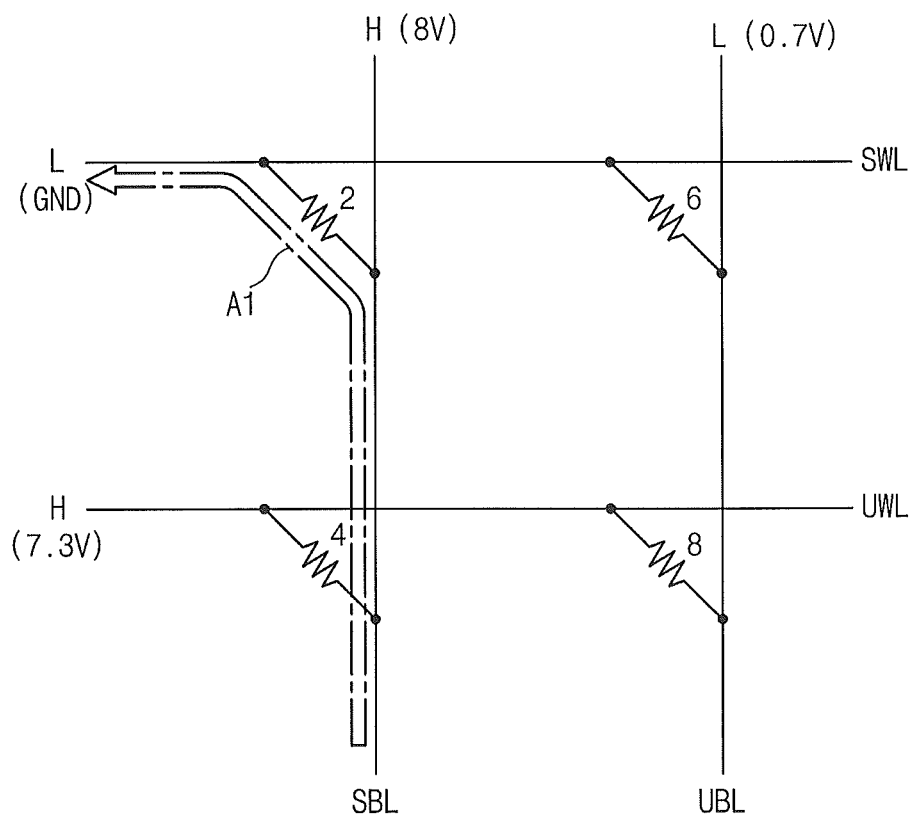
FIG. 2 is a diagram illustrating a set operation of a memory cell.
Figure 3:
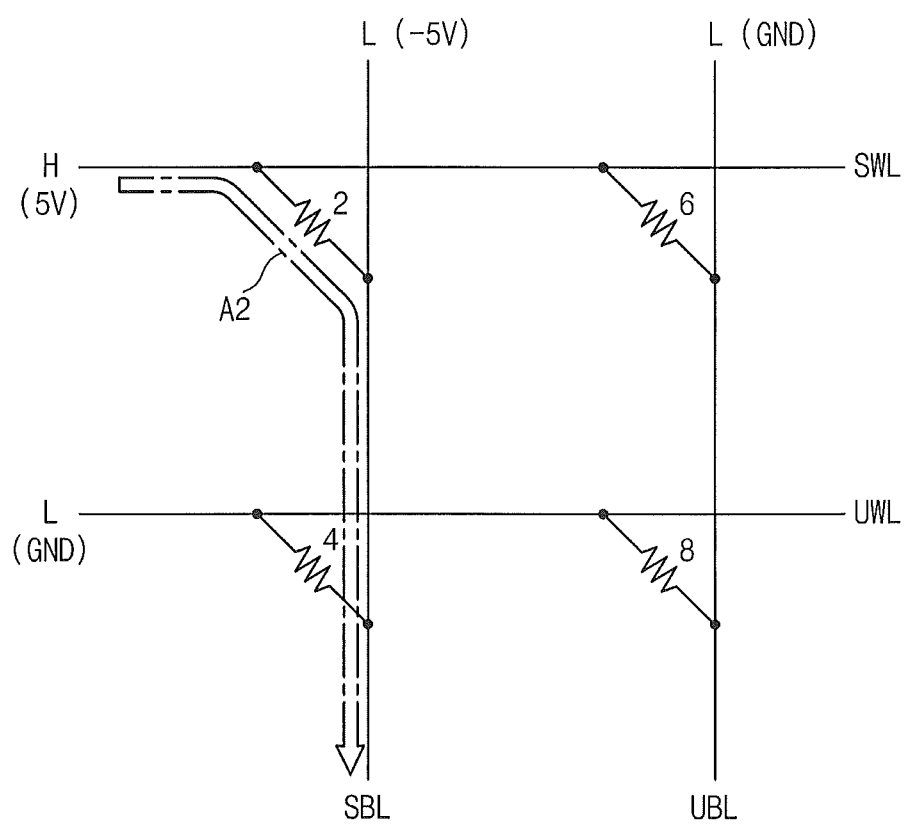
FIG. 3 is a diagram illustrating a reset operation of a memory cell.

FIG. 2 is a diagram illustrating a set operation of a memory cell. FIG. 3 is a diagram illustrating a reset operation of a memory cell. Referring to FIG. 2, a reference symbol "A1" indicates a set current applied to a selected memory cell 2 at a set operation of a write mode of operation. Herein, the selected memory cell 2 and unselected memory cells 4, 6, and 8 may be resistive memory cells.

A resistive memory cell may have a lower electrode and an upper electrode. A node having a lower contact area, an upper contact area, and an intermediate area between the lower contact area and the upper contact area may be disposed between the lower electrode and the upper electrode. A lower metal oxide film contacting with the lower electrode and the lower contact area may be disposed between the lower electrode and the node. An upper metal oxide film contacting with the upper contact area and the upper electrode may be disposed between the node and the upper electrode.

The lower metal oxide film may be a two-component system metal oxide film, for example, a hafnium oxide film (e.g., HfOx, 1.5≤x≤2), a tantalum oxide film (e.g., Ta2Oy, 2≤y≤5), a zirconium oxide film (e.g., ZrOx, 1.5≤x≤2), a zinc oxide film (e.g., ZnOx, 0.5≤x≤1), a titanium oxide film (e.g., TiOx, 1.5≤x≤2), a molybdenum oxide film (e.g., MoOx, 2≤x≤3), a tungsten oxide film (e.g., WOx, 2≤x≤3), a nickel oxide film (e.g., NiOx, 0.5≤x≤1), an aluminum oxide film (e.g., Al2Ox, 2≤x≤3), or a silicon oxide film (e.g., SiOx, 1.5≤x≤2).

The upper metal oxide film may be a two-component system metal oxide film, for example, a hafnium oxide film (e.g., HfOx, 1.5≤x≤2), a tantalum oxide film (e.g., Ta2Oy, 2≤y≤5), a zirconium oxide film (e.g., ZrOx, 1.5≤x≤2), a zinc oxide film (e.g., ZnOx, 0.5≤x≤1), a titanium oxide film (e.g., TiOx, 1.5≤x≤2), a molybdenum oxide film (e.g., MoOx, 2≤x≤3), a tungsten oxide film (e.g., WOx, 2≤x≤3), a nickel oxide film (e.g., NiOx, 0.5≤x≤1), an aluminum oxide film (e.g., Al2Ox, 2≤x≤3), or a silicon oxide film (e.g., SiOx, 1.5≤x≤2).

The lower metal oxide film and the upper metal oxide film may include the same material film.

The intermediate area of the node may be an interface between the upper and lower contact areas or a conductive film placed between the upper and lower contact areas, such as a platinum film, a tungsten film, a titanium film, an aluminum film, a titanium nitride film, a tantalum nitride film, or a nickel film.

In FIG. 2, there is illustrated a structure of a memory cell array in which memory cells formed of variable resistors without an access transistor formed of a diode or transistor are connected between word lines and bit lines in a cross-point shape.

A set operation for storing data '0' at a selected memory cell may be performed by applying a high voltage (e.g., 8V) to a selected bit line SBL and a low voltage (e.g., a ground voltage GND) to a selected word line SWL. At the set operation, a low voltage (e.g., 0.7V) may be applied to an unselected bit line UBL, and a high voltage (e.g., 7.3V) may be applied to an unselected word line UWL.

Thus, a set current may flow into a selected memory cell 2 along a direction designated by a reference symbol A1, and the selected memory cell 2 may be programmed (or, written) to have a set state.

Referring to FIG. 3, a reference symbol A2 indicates a reset current applied to the selected memory cell 2 at a reset operation of a write mode of operation.

A reset operation for storing data '1' at a selected memory cell may be performed by applying a low voltage (e.g., −5V) to a selected bit line SBL and a high voltage (e.g., 5V) to a selected word line SWL. At the reset operation, a low voltage (e.g., a ground voltage) may be applied to an unselected bit line UBL and an unselected word line UWL, respectively.

Thus, a reset current may flow into a selected memory cell 2 along a direction designated by a reference symbol A2, and the selected memory cell 2 may be programmed (or, written) to have a reset state.

In case of FIG. 3, since a voltage of 5V may be across a half-selected memory cell 6, a reset leakage current may be generated. Also, in case of FIG. 2, since a voltage of 6.6V may be across an unselected memory cell 8, a set leakage current may be generated. It will be understand that as used herein, the term "half-selected" includes operation where only one of the word line and the bit line connected to the particular cell has a selected voltage applied.

A conventional biasing method which may reduce a leakage current between unselected memory cells and a selected memory is described with reference to FIG. 4.

Figure 4:
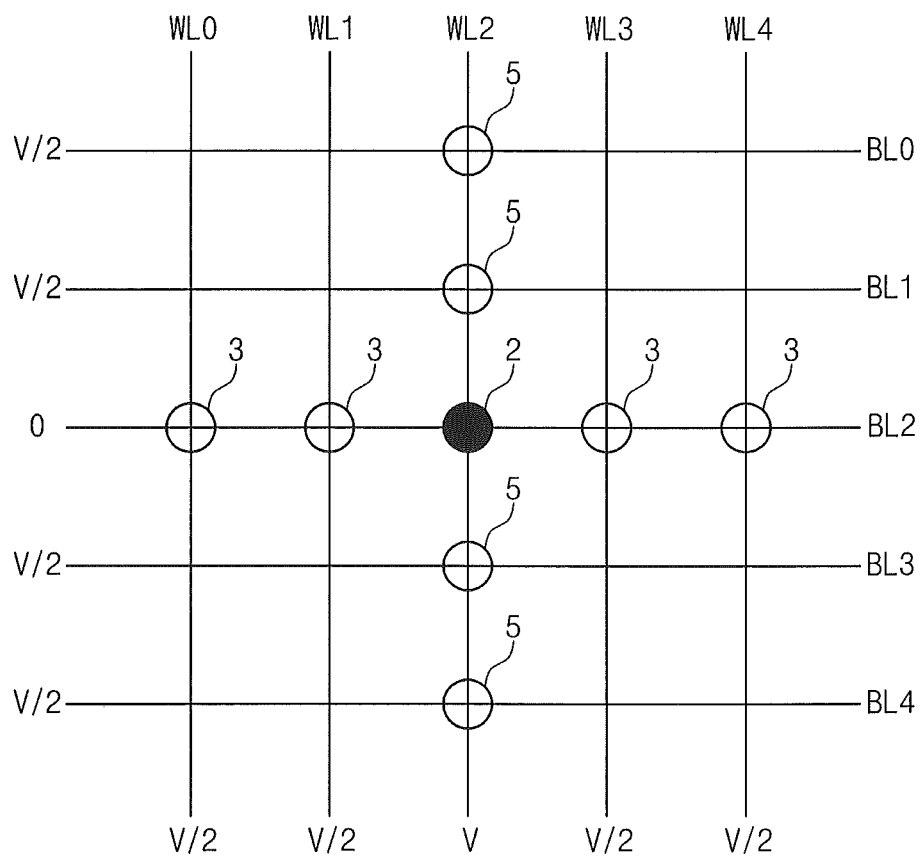
FIG. 4 is a diagram illustrating voltages applied to word lines and bit lines.

FIG. 4 is a diagram illustrating voltages applied to word lines and bit lines. Referring to FIG. 4, there are illustrated a selected memory cell 2 and peripheral cells 3 and 5 disposed to be adjacent to the selected memory cell 2.

At a read or write operation, an operating voltage V may be applied to a word line WL2 of a selected memory cell 2, and a ground voltage (e.g., 0V) may be applied to a bit line BL2 of the selected memory cell 2. A half operating voltage V/2 may be applied to word lines WL0, WL1, WL3, and WL4 of unselected memory cells 3 and to bit lines BL0, BL1, BL3, and BL4 of unselected memory cells 5.

Since the memory cells 3 and 5 are supplied with the half operating voltage V/2 through corresponding word line or bit lines, those may correspond to half-selected cells. Since the half operating voltage supplied to the half-selected cells may cause a leakage current, analysis on a line delay may be used to reduce the leakage current as illustrated in FIG. 5.

Figure 5:
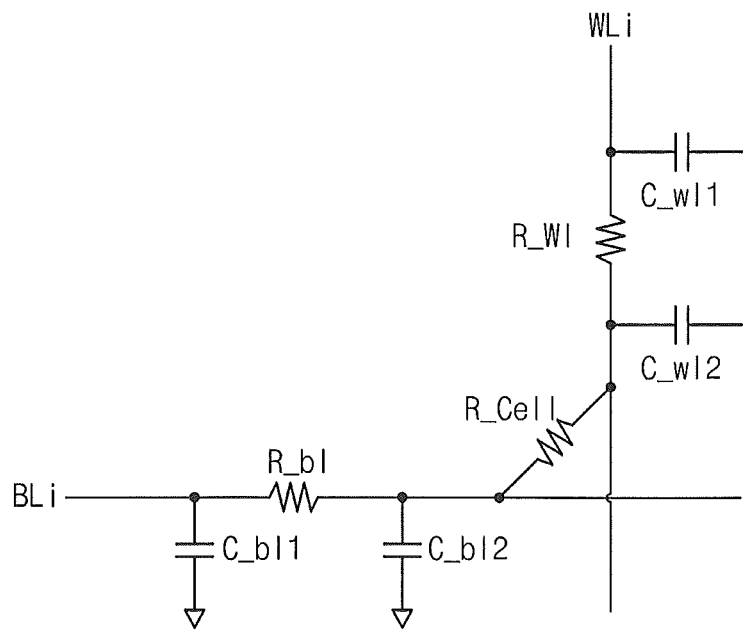
FIG. 5 is an equivalent circuit of a memory cell.

FIG. 5 is an equivalent circuit of a memory cell. Referring to FIG. 5, there is illustrated an equivalent circuit on line delay components associated with a selected or unselected (or, half-selected) memory cell. In FIG. 5, "R_cell" may indicate equivalent resistance, "R_wl" may indicate equivalent resistance of a word line, and "C_wl1" and "C_wl2" may indicate equivalent capacitance of a word line, respectively. Also, "R_bl" may indicate equivalent resistance, and "C_bl1" and "C_bl2" may indicate equivalent capacitance of a bit line, respectively.

Thus, a line delay on a memory cell may be a time constant decided according to parasitic resistance and capacitance of a word line and a bit line. If an operating pulse having a width less than the line delay is applied, a selected memory cell may not be influenced by the line delay, and peripheral memory cells may be influenced by the line delay. Thus, leakage currents generated at the peripheral memory cells may be reduced. In this case, interference causing an abnormal operation at a read or write operation may be reduced. This means that the probability that a memory device operates abnormally may be lowered.

Figure 6:
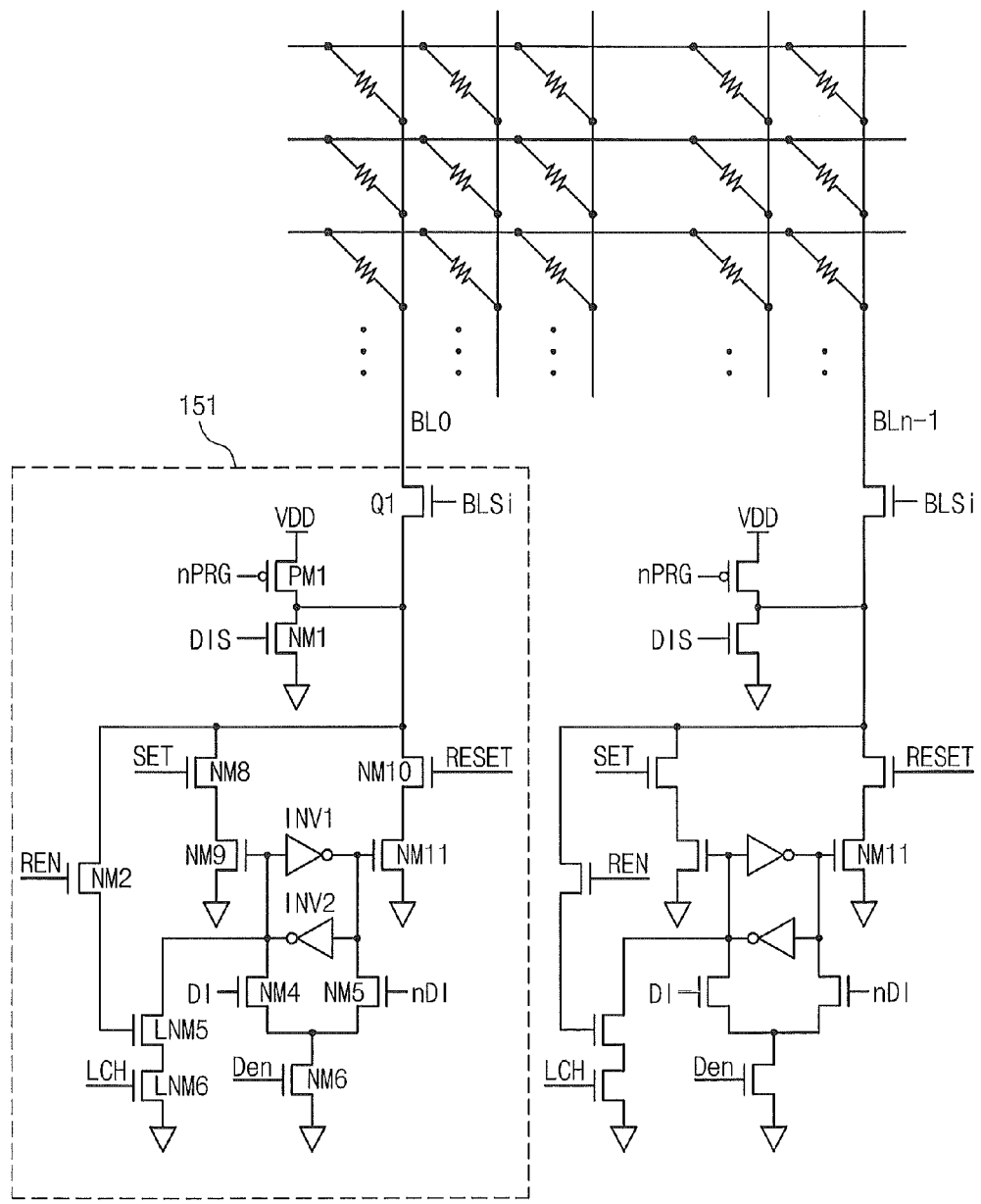
FIG. 6 is a circuit diagram illustrating a read and write circuit unit according to some embodiments of the inventive concept.
Figure 7:
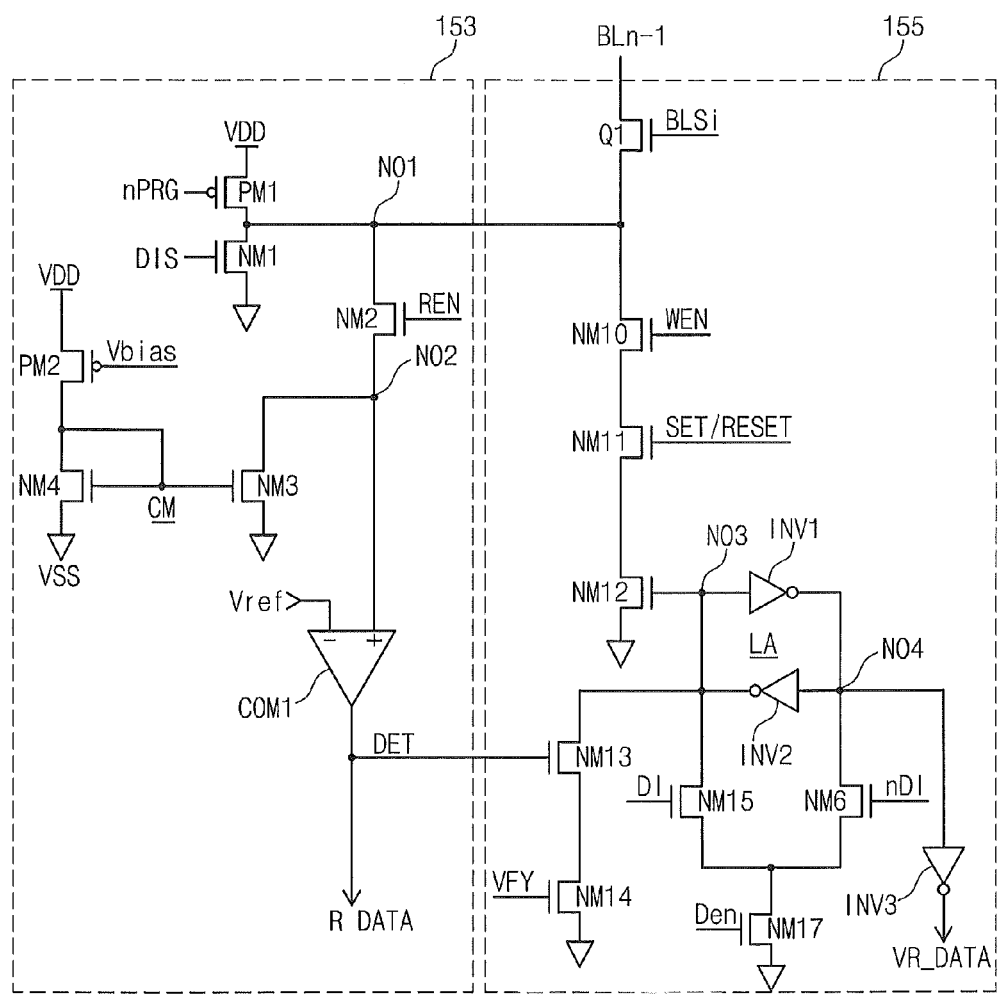
FIG. 7 is a circuit diagram illustrating read and write circuit units according to some embodiments of the inventive concept.

A read and write circuit unit in an input/output circuit 150 of FIG. 1 will be illustrated in FIGS. 6 and 7. The read and write circuit unit 150 may apply a write operating voltage and a read operating voltage in a pulse shape within a period shorter than or equal to the line delay at a write operation and a read operation.

FIG. 6 is a circuit diagram illustrating a read and write circuit unit according to some embodiments of the inventive concept. FIG. 7 is a circuit diagram illustrating read and write circuit units according to some embodiments of the inventive concept.

Referring to FIG. 6, there is illustrated a read and write circuit unit 151 connected with a bit line (e.g., BL0). The read and write circuit unit 151 may read data stored at a memory cell at a read operation and store data '0' or '1' at a selected memory cell at a write operation. The read and write circuit unit 151 may include MOS transistors Q1, PM1, NM1, NM2, NM4, NMS, NM6, NM8 to NM11, LNM5, and LNM6 and an inverter latch INV1 and INV2.

As the MOS transistor Q1 is turned on by activation of a bit line selection signal BLSi at a read or write operation, the read and write circuit unit 151 may be electrically connected with a bit line (e.g., BL0).

The MOS transistors PM1 and NM1 may play a role of biasing a bit line voltage. The MOS transistor PM1 may provide the bit line BL0 with an operating voltage (e.g., a read voltage, a set voltage, a reset voltage, or a forming voltage) in response to an operating voltage applying signal nPRG. The MOS transistor NM1 may ground the bit line BL0 in response to a discharge signal DIS. The operating voltage applying signal nPRG and the discharge signal DIS may be provided from a control circuit 160 of FIG. 1.

Figure 9:
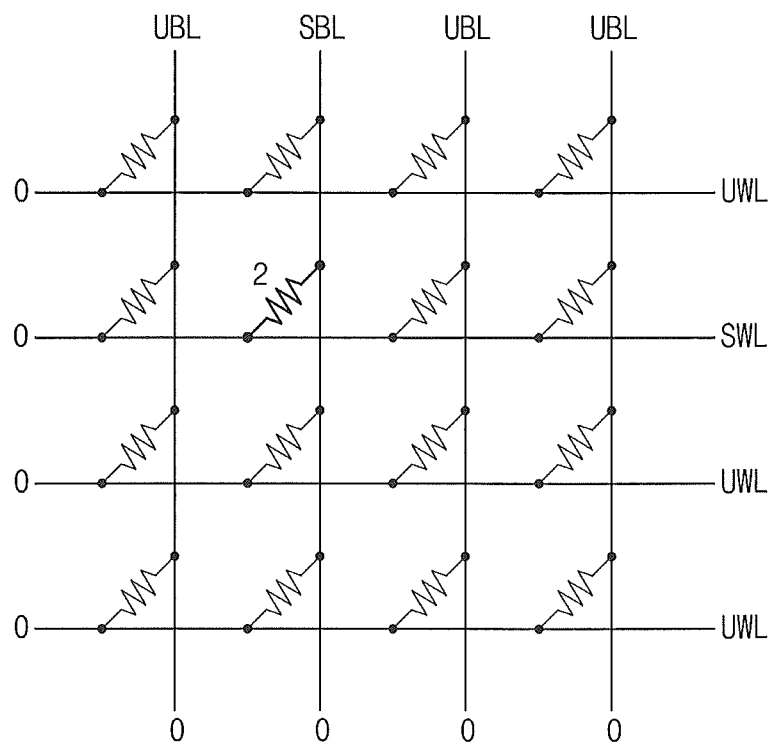
FIG. 9 is a diagram illustrating bias condition for applying an initial voltage according to some embodiments of the inventive concept.
Figure 10:
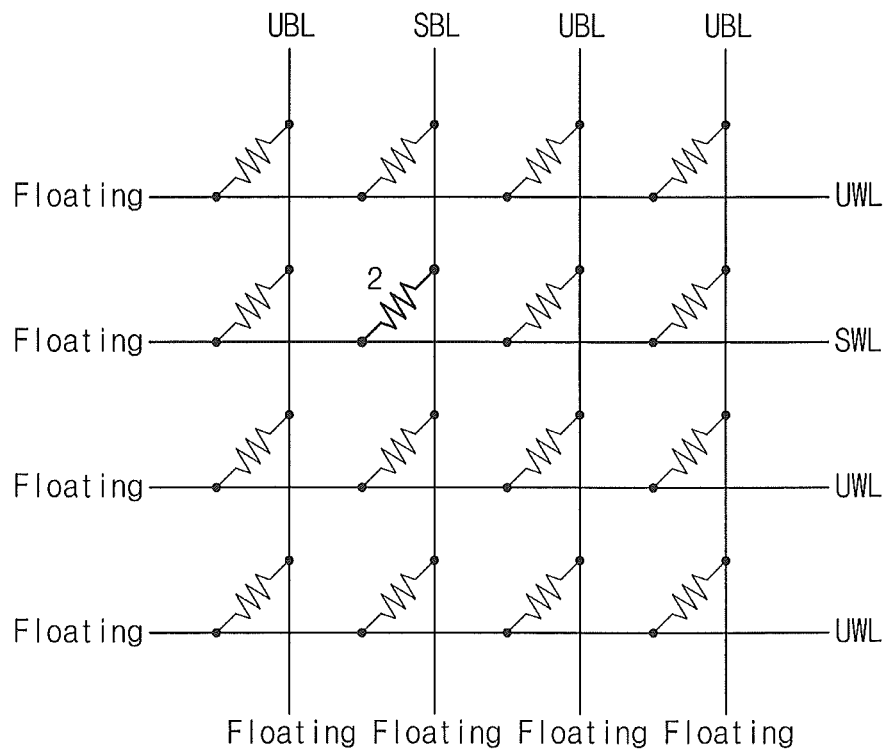
FIG. 10 is a diagram illustrating bias condition for setting word lines and bit lines to a floating state according to some embodiments of the inventive concept.
Figure 11:
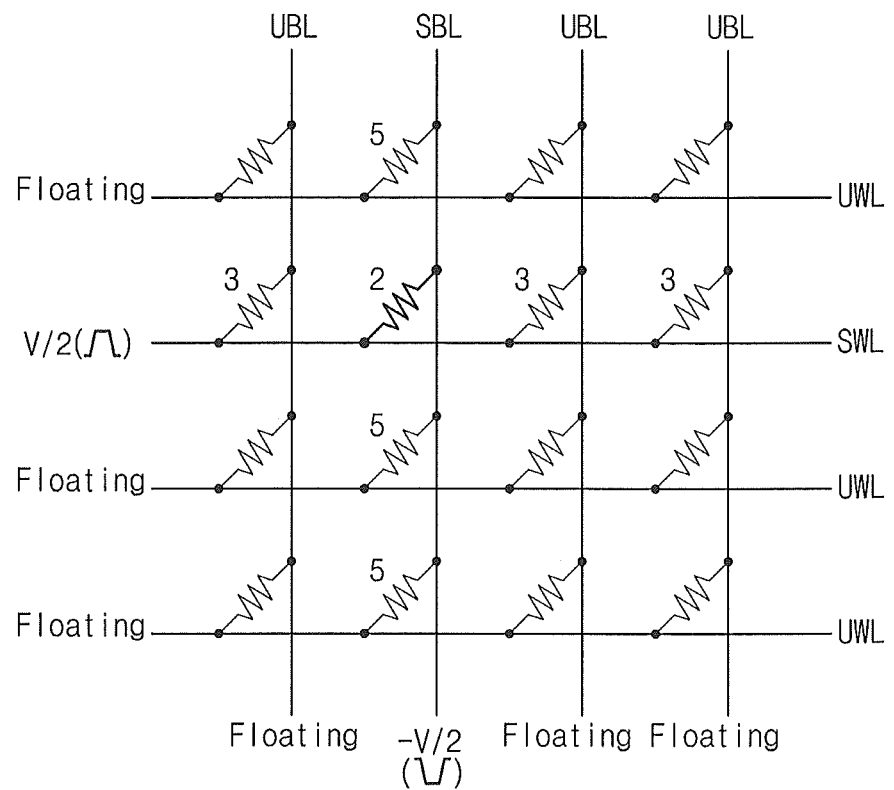
FIG. 11 is a diagram illustrating bias condition for applying an operating voltage set according to some embodiments of the inventive concept.

At a read operation, all word lines and all bit lines may be initialized as illustrated in FIG. 9 and then may be floated at illustrated in FIG. 10. Under a state where a floating state illustrated in FIG. 10 is maintained, as illustrated in FIG. 11, a read operating voltage V/2 may be applied to a word line of a selected memory cell 2 and a read operating voltage—V/2 may be applied to a bit line of the selected memory cell 2.

If the MOS transistor NM2 is turned on by a read enable signal REN and a selected memory cell is at a set state being a low-resistance state, the MOS transistor LNM5 may be turned on, so that data '0' is latched at an output stage of the inverter INV2 in the inverter latch INV1 and INV2. If the MOS transistor NM2 is turned on and the selected memory cell is at a reset state being a high-resistance state, the MOS transistor LNM5 may be turned off, so that data '1' is latched at an output stage of the inverter INV2 in the inverter latch INV1 and INV2.

At a set operation of a write mode of operation, all bit lines and all word lines may be initialized as illustrated in FIG. 9 and then may be floated as illustrated in FIG. 10. Under a state where a floating state illustrated in FIG. 10 is maintained, as illustrated in FIG. 11, a set operating voltage V/2 may be applied to a word line of the selected memory cell 2 and a set operating voltage −V/2 may be applied to a bit line of the selected memory cell 2. Herein, the read operating voltage V/2 and the set operating voltage V/2 may have different voltage levels. The set operating voltage V/2 may be relatively higher than the read operating voltage V/2. A width of a voltage pulse may be equal to or less than a line delay period. The read operating voltage V/2 and the set operating voltage V/2 may have the same pulse width.

The MOS transistor NM8 may be turned on by a set enable signal SET, write data '0' may be applied to a gate terminal DI of the MOS transistor NM4, and complementary write data '1' may be applied to a gate terminal nDI of the MOS transistor NM5.

The MOS transistor NM5 may be turned on when the MOS transistor NM6 is turned on by a data enable signal Den. As an output terminal of the inverter INV1 goes to a low state, an output terminal of the inverter INV2 may go to a high state. At this time, the MOS transistor NM9 may be turned on. Thus, write data '0' may be latched by the inverter latch for a set operation.

The MOS transistor PM1 may provide a set voltage pulse to a bit line of a selected memory cell. Since a current flows through the selected memory cell according to biasing of the set operating voltage V, the selected memory cell may be set to a low-resistance state.

At a reset operation of the write mode of operation, all bit lines and all word lines may be initialized as illustrated in FIG. 9 and then floated as illustrated in FIG. 10. Under a state where a floating state illustrated in FIG. 10 is maintained, as illustrated in FIG. 11, a reset operating voltage V/2 may be applied to a word line of the selected memory cell 2, and a reset operating voltage −V/2 may be applied to a bit line. Herein, the set operating voltage V/2 and the reset operating voltage V/2 may have different voltage levels. The reset operating voltage V/2 may be relatively higher or lower than the set operating voltage V/2. A width of a voltage pulse may be equal to or less than a line delay period. The set operating voltage V/2 and the reset operating voltage V/2 may have different pulse widths.

The MOS transistor NM10 may be turned on by a reset enable signal RESET, write data '1' may be applied to a gate terminal DI of the MOS transistor NM4, and complementary write data '0' may be applied to a gate terminal nDI of the MOS transistor NMS.

The MOS transistor NM4 may be turned on when the MOS transistor NM6 is turned on by the data enable signal Den. As an output terminal of the inverter INV1 goes to a high state, an output terminal of the inverter INV2 may go to a low state. At this time, the MOS transistor NM11 may be turned on. Thus, write data '1' may be latched by the inverter latch for a reset operation.

The MOS transistor PM1 may provide a reset voltage pulse to a bit line of a selected memory cell. Since current flow through the selected memory cell according to biasing of the reset operating voltage V, the selected memory cell may be reset to a high-resistance state.

An example describes that data '0' is stored by the set operation and data 1' is stored by the reset operation. However, the inventive concept is not limited thereto. For example, data '1' may be stored by the set operation and data '0' may be stored by the reset operation.

A read circuit unit 153 and a write circuit unit 155 in an input/output circuit 150 of FIG. 1 will be described with reference to FIG. 7.

A read circuit unit 153 may read data stored at a selected memory cell, and may include MOS transistors PM1, PM2, and NM1 to NM4, a current mirror CM, and a comparator COM1.

A write circuit unit 155 may store data at a selected memory cell, and may include MOS transistors Q1 and NM10 to NM17, a latch LA, and an inverter INV3.

At a read or write operation, the MOS transistor Q1 may be turned on by activation of a bit line selection signal BLSi. At this time, the read circuit unit 153 and the write circuit unit 155 may be electrically connected with a bit line (e.g., BL0).

The MOS transistors PM1 and NM1 of the read circuit unit 153 may play a role of biasing a bit line voltage as described with reference to FIG. 6. The MOS transistor PM1 may provide the bit line BLO with an operating voltage (e.g., a read voltage, a set voltage, a reset voltage, or a forming voltage) in response to an operating voltage applying signal nPRG. The MOS transistor NM1 may ground the bit line BLO in response to a discharge signal DIS. The operating voltage applying signal nPRG and the discharge signal DIS may be provided from a control circuit 160 of FIG. 1.

At a read operation, all word lines and all bit lines may be initialized as illustrated in FIG. 9 and then may be floated at illustrated in FIG. 10. Under a state where a floating state illustrated in FIG. 10 is maintained, as illustrated in FIG. 11, a read operating voltage V/2 may be applied to a word line of a selected memory cell 2, and a read operating voltage −V/2 may be applied to a bit line of the selected memory cell 2.

If the MOS transistor NM2 is turned on by a read enable signal REN and a selected memory cell is at a set state being a low-resistance state, a voltage level of a non-inverting terminal (+) of the comparator COM1 may be higher than that of an inverting terminal (−) of the comparator COM1. Thus, an output terminal DET of the comparator COM1 may go to a high state. At this time, the high state of the output terminal DET may be changed into a low state through an inverter. That is, data '0' may be output.

If the MOS transistor NM2 is turned on by the read enable signal REN under the assumption that the selected memory cell is at a reset state being a high-resistance state, a voltage level of the non-inverting terminal (+) of the comparator COM1 may be lower than a reference level of a reference voltage Vref applied to the inverting terminal (−) of the comparator COM1. Thus, the output terminal DET of the comparator COM1 may go to a low state. At this time, the low state of the output terminal DET may be changed into a high state through an inverter. That is, data '1' may be output.

The current mirror CM may play a role of mirroring a reference current flowing to a reference branch (formed by the transistors PM2 and PM4) to a mirror current branch (a portion where a node NO2 exists) connected with the non-inverting terminal (+) of the comparator COM1.

At a set operation of the write mode of operation, all bit lines and all word lines may be initialized as illustrated in FIG. 9 and then may be floated as illustrated in FIG. 10. Under a state where a floating state illustrated in FIG. 10 is maintained, as illustrated in FIG. 11, a set operating voltage V/2 may be applied to a word line of the selected memory cell 2, and a set operating voltage −V/2 may be applied to a bit line. Herein, the read operating voltage V/2 and the set operating voltage V/2 may have different voltage levels. The set operating voltage V/2 may be relatively higher than the read operating voltage V/2. A width of a voltage pulse may be equal to or less than a line delay period. The read operating voltage and the set operating voltage may have the same pulse width.

The MOS transistors Q1, NM10, and NM11 may be turned on by the bit line selection signal BLSi, a write enable signal WEN, and the set enable signal SET, respectively. Write data '0' may be applied to a gate terminal DI of the MOS transistor NM15, and write data '1' may be applied to a gate terminal nDI of the MOS transistor NM16.

The MOS transistor NM16 may be turned on when the MOS transistor NM17 is turned on by the data enable signal Den. As an input terminal of the inverter INV2 goes to a low state, an output terminal of the inverter INV2 may go to a high state. At this time, the MOS transistor NM12 may be turned on. Thus, write data '0' may be latched by the inverter latch for a set operation.

The MOS transistor PM1 may provide a set voltage pulse to a bit line of a selected memory cell. Since a current flows through the selected memory cell according to biasing of the set operating voltage V, the selected memory cell may be set to a low-resistance state.

At a reset operation of the write mode of operation, all bit lines and all word lines may be initialized as illustrated in FIG. 9 and then floated as illustrated in FIG. 10. Under a state where a floating state illustrated in FIG. 10 is maintained, as illustrated in FIG. 11, a reset operating voltage V/2 may be applied to a word line of the selected memory cell 2, and a reset operating voltage −V/2 may be applied to a bit line. Herein, the set operating voltage V/2 and the reset operating voltage V/2 may have different voltage levels. The reset operating voltage V/2 may be relatively higher or lower than the set operating voltage V/2. Only, a width of a voltage pulse may be decided within a line delay period, and the set operating voltage and the reset operating voltage may have different pulse widths.

The MOS transistors Q1, NM10, and NM11 may be turned on by the bit line selection signal BLSi, the write enable signal WEN, and the reset enable signal RESET, respectively. Write data '1' may be applied to the gate terminal DI of the MOS transistor NM15, and complementary write data '0' may be applied to the gate terminal nDI of the MOS transistor NM16.

The MOS transistor NM16 may be turned on when the MOS transistor NM17 is turned on by the data enable signal Den. As an input terminal of the inverter INV2 goes to a low state, an output terminal of the inverter INV2 may go to a high state. At this time, the MOS transistor NM12 may be turned off. Thus, write data '1' may be latched by the inverter latch for a reset operation.

The MOS transistor PM1 may provide a reset voltage pulse to a bit line of a selected memory cell. Since a current flows through the selected memory cell according to biasing of the reset operating voltage V, the selected memory cell may be set to a high-resistance state.

In case of a verify mode of operation, when the MOS transistor NM14 is turned on by a verify control signal VFY, the MOS transistor NM13 may be turned on by a high state of the output terminal DET. In this case, a node NO3 of the inverter latch LA may go to a low state. Thus, data '0' may be latched at an output terminal of the inverter INV2 in the inverter latch LA.

An example describes that '0' is stored by the set operation and data '1' is stored by the reset operation. However, the inventive concept is not limited thereto. For example, data '1' may be stored by the set operation and data '0' may be stored by the reset operation.

Figure 8:
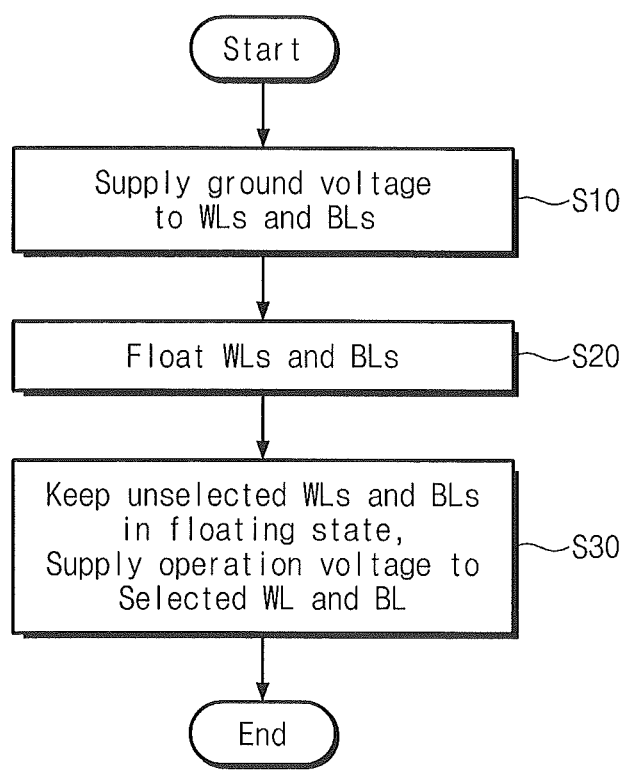
FIG. 8 is a flowchart illustrating a driving method according to some embodiments of the inventive concept.

FIG. 8 is a flowchart illustrating a driving method according to some embodiments of the inventive concept. In operation S10, as illustrated in FIG. 9, an initial voltage (e.g., a ground voltage) may be applied to all bit lines and all word lines. In operation S20, as illustrated in FIG. 10, all bit lines and all word lines may be floated. In operation S30, an operating voltage pulse may be applied to a selected word line and a selected bit line at a floating maintenance state illustrated in FIG. 10.

Operations S10, S20, and S30 may be accomplished by controlling an input/output circuit 150 through a control circuit 160 of FIG. 1.

FIG. 9 is a diagram illustrating bias condition for applying an initial voltage according to some embodiments of the inventive concept. In FIG. 9, "SWL" indicates a selected word line, "UWL" indicates an unselected word line, "SBL" indicates a selected bit line, and "UBL" may indicate an unselected bit line.

A memory cell 2 connected with a selected word line and a selected bit line may be a selected memory cell. In FIG. 9, an initial voltage (e.g., a ground voltage: 0V) may be applied to all word lines including selected and unselected word lines, and the initial voltage (e.g., a ground voltage: 0V) may be applied to all bit lines including selected and unselected bit lines.

FIG. 10 is a diagram illustrating bias condition for setting word lines and bit lines to a floating state according to some embodiments of the inventive concept. In FIG. 10, all word lines including selected and unselected word lines may be floated under the control of a control circuit 160. Also, all bit lines including selected and unselected bit lines may be floated under the control of the control circuit 160. An operating voltage may be applied to a selected word line and a selected bit line as illustrated in FIG. 11 to perform an operation according to the present inventive concept while the condition that a floating state illustrated in FIG. 10 is maintained.

FIG. 11 is a diagram illustrating bias condition for applying an operating voltage set according to some embodiments of the inventive concept. As illustrated in FIG. 11, operating voltage pulses may be applied to a selected word line and a selected bit line to while the condition that a floating state illustrated in FIG. 10 is maintained. For example, a positive pulse voltage V/2 may be applied to a selected word line SWL, and a negative pulse voltage −V/2 may be applied to a selected bit line SBL. "V" indicates an operating voltage whose levels may be set differently according to each mode of operation, such as a set operation corresponding to one of read and write operations, a reset operation corresponding to the other one of the read and write operations, and a forming operation for forming memory cells.

As biasing voltage pulses are applied as illustrated in FIG. 11, a selected memory cell 2 may be driven with reduced influence of a line delay, and half-selected memory cells 3 and 5 and unselected memory cells may be influenced by the line delay. This will be more fully described with reference to FIG. 12.

Figure 12:
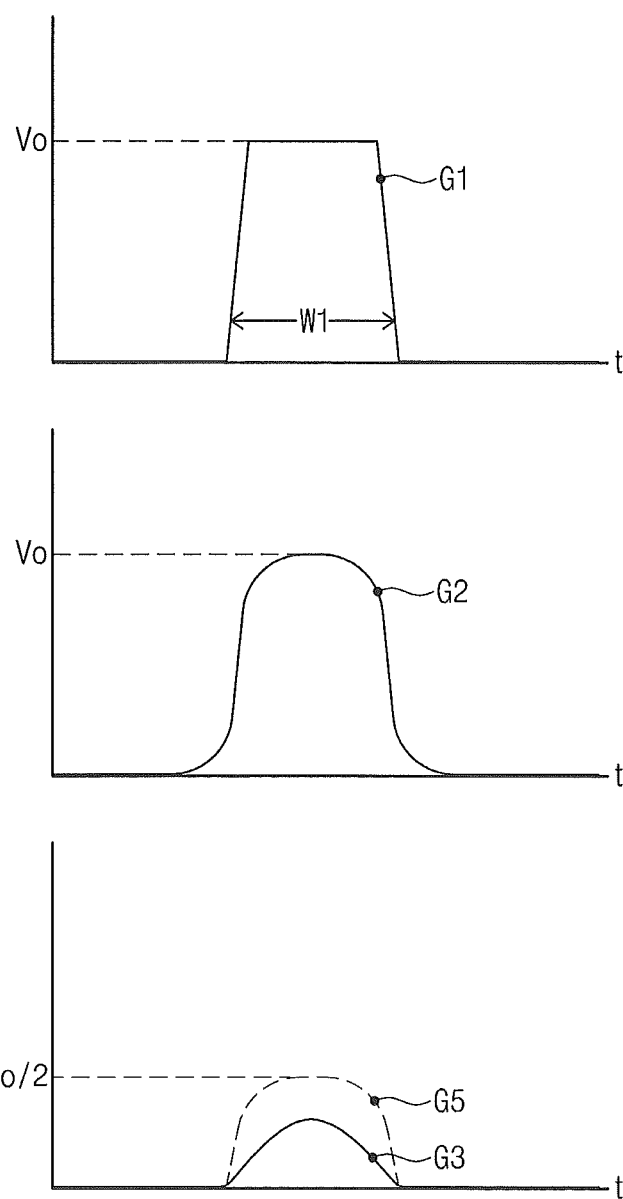
FIG. 12 is a diagram illustrating voltage pulses applied to selected and unselected memory cells according to some embodiments of the present inventive concept.

FIG. 12 is a diagram illustrating voltage pulses applied to selected and unselected memory cells according to some embodiments of the present inventive concept.

Referring to FIG. 12, a horizontal axis may indicate a time and a vertical axis may indicate a voltage. A graph G1 may indicate a voltage pulse applied. A width of the voltage pulse may be equal to or less than a width W1 of a line delay according to an RC time constant. Thus, influenced of the line delay on a selected memory cell may be reduced and thus a voltage pulse described as G2 may be applied to the selected memory cell. Meanwhile, since half-selected memory cells or unselected memory cells are influenced by the line delay, a voltage pulse described as G3 may be applied thereto. A voltage pulse of a graph G5 may be a voltage applied to half-selected memory cells in case of FIG. 4. According to some embodiments of the present inventive concept, as half-selected memory cells or unselected memory cells are supplied with such a voltage pulse as the graph G3, not the graph G5, a leakage current between memory cells may be reduced.

In FIG. 12, "Vo" may indicate a level of a voltage pulse supplied to a selected memory cell 2 (refer to FIG. 11), and "Vo/2" may indicate a level of a voltage pulse applied to half-selected memory cells or unselected memory cells.

An operating manner for applying a pulse having a width less than a line delay may be used, so that an abnormal operation due to the interference between memory cells may be reduced.

Figure 13:
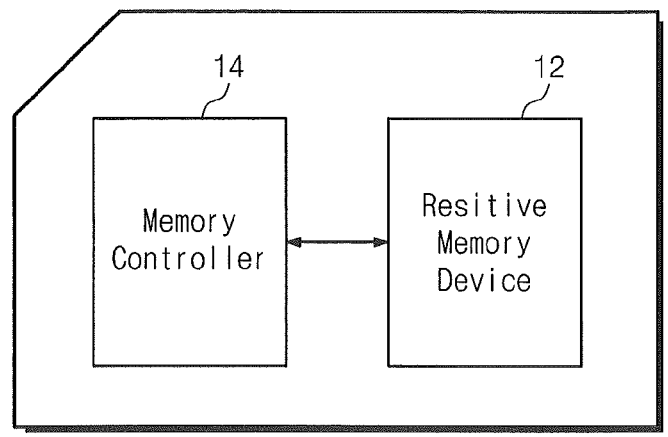
FIG. 13 is a block diagram illustrating a memory card including a resistive memory device according to some embodiments of the inventive concept.

FIG. 13 is a block diagram illustrating a memory card including a resistive memory device according to some embodiments of the inventive concept. Referring to FIG. 13, a memory card 10 may include a resistive memory device 12 according to some embodiments of the present inventive concept and a memory controller 14 controlling the resistive memory device 12. The memory card 10 may be used to store and read information together with digital devices such as a digital camera, a PDA, a handheld audio device, a cellular phone, and a personal computer. The digital devices may process data by the cluster, and the memory card 10 applied to the inventive concept may process data by the cluster.

In FIG. 13, the resistive memory device 12 may be an MRAM, for example. As the resistive memory device, the MRAM may be a memory using such a characteristic that a spin is divided into up and down. That is, the MRAM may be a nonvolatile memory technique using magnetic characteristics. For example, the STT-MRAM may use electrons spin-polarized when the electrons penetrate a thin film (e.g., a spin filter). Also, the STY-MRAM may be divided into an STT-RAM, a spin momentum transfer RAM (SMT-RAM), and a spin transfer torque magnetisation switching RAM (Spin-RAM).

A MRAM using a magneto-resistance effect for changing resistance of a conductive material using a magnetic field may include a plurality of resistance memory cells formed by MTJ (Magnetic Tunnel Junction).

A tunneling current (or, tunneling resistance) flowing through the MTJ may vary according to a magnetization state of a ferromagnetic material. The ferromagnetic material may include a free layer and a pinned layer with the MTJ interposed therebetween. The tunneling resistance may be low when magnetization directions of the free and pinned layers are parallel and high when magnetization directions of the free and pinned layers are anti-parallel. In the event that an anti-ferromagnetic layer called a pinning layer is added to the pinned layer, a magnetization direction of the pinned layer may be fixed and the tunneling resistance may vary according to a magnetization direction of the free layer. Herein, the magnetization direction of the free layer may be switched using a magnetic field formed by currents flowing along a bit line and a word line. In the above-described method, as a resistive memory device is highly integrated, coercivity of the free layer may increase. This may cause unwanted switching of the free layer. Thus, there may be a growing interest in a magnetic memory device using a spin transfer torque manner or a magnetic memory device using a toggle switching writing manner.

The magnetic memory device using a spin transfer torque manner may switch a free layer in a required direction using a spin transfer of electron by providing a current in a direction where a spin is polarized. This may mean that the amount of current required is relatively reduced according to scale-down of a cell size. Thus, it is possible to integrate the resistive memory device highly.

A word line and a bit line may be disposed to be inclined by a 40° direction at an intersection, and MTJ may include a second magnetic area, a tunneling barrier, and a first magnetic area which are sequentially stacked. Herein, the first and second magnetic areas may include an SAF (Synthetic Anti-Ferromagnetic) structure which includes an upper ferromagnetic layer, a lower ferromagnetic layer, and a diamagnetic coupling spacer layer inserted between the upper ferromagnetic layer and the lower ferromagnetic layer.

Figure 14:
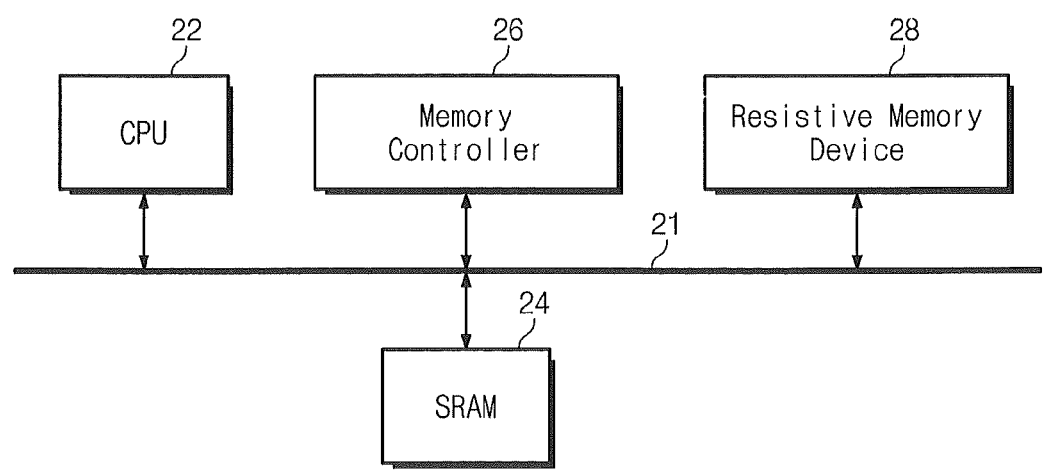
FIG. 14 is a block diagram illustrating a memory system including a resistive memory device according to some embodiments of the inventive concept.

FIG. 14 is a block diagram illustrating a memory system including a resistive memory device according to some embodiments of the inventive concept. Referring to FIG. 14, a memory system 20 may include a CPU 22, an SRAM 24, a memory controller 26, and a resistive memory device 28 which are electrically connected with a bus 21. Herein, the resistive memory device 28 is a resistive memory device according to some embodiments of the present inventive concept. N-bit data (N being an integer being 1 or more than 1) processed or to be processed by the CPU 22 may be stored at the resistive memory device 28 through the memory controller 26. The memory system 20 may further comprise an application chipset, a camera image processor (CIS), a mobile DRAM, and so on. The memory controller 26 and the resistive memory device 28 may constitute a solid state drive (SSD), for example.

A resistive memory device in FIGS. 13 and 14 may have a cross-point array structure suitable for mass storage. Also, an operating manner for applying a pulse having a width less than a line delay may be used, so that interference between memory cells causing abnormal operation may be reduced.

Figure 15:
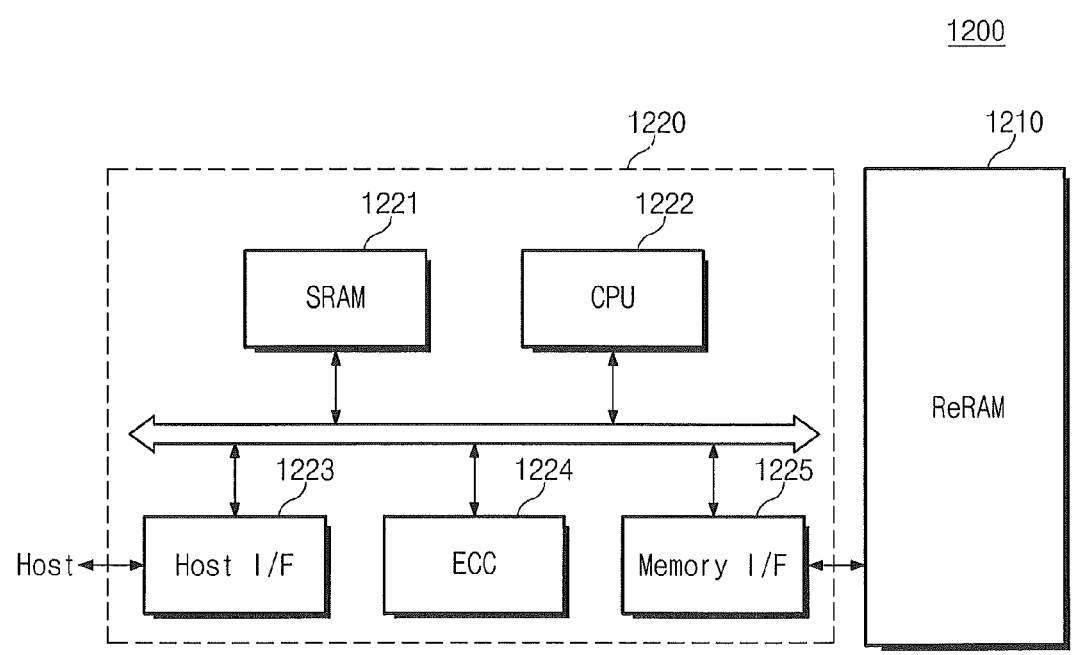
FIG. 15 is a block diagram illustrating a memory card including a resistive memory device according to some embodiments of the inventive concept.

FIG. 15 is a block diagram illustrating a memory card including a resistive memory device according to some embodiments of the inventive concept. A resistive memory device 1210 according to some embodiments of the inventive concept may be used to a memory card 1200. For example, the memory card 1200 may include a memory controller 1220 which controls data exchange between a host and the resistive memory device 1210 overall.

In the memory controller 1220, an SRAM 1221 may be used as a working memory of a CPU 1222. A host interface 1223 may have the data exchange protocol of the host connected with the memory card 1200. An ECC block 1224 may detect and correct an error included in data read from the resistive memory device 1210. A memory interface 1225 may provide an interface between the resistive memory device 1210 and the memory controller 1220. The CPU 1222 may perform an overall control operation for data exchange of the memory controller 1220.

An operating voltage set at a write or read operation may be applied to a selected memory cell of the resistive memory device 1210 within a line delay period of time. Thus, an abnormal operation due to the interference between a selected memory cell and peripheral memory cells may be reduced, so that the performance of the memory card is improved.

Figure 16:
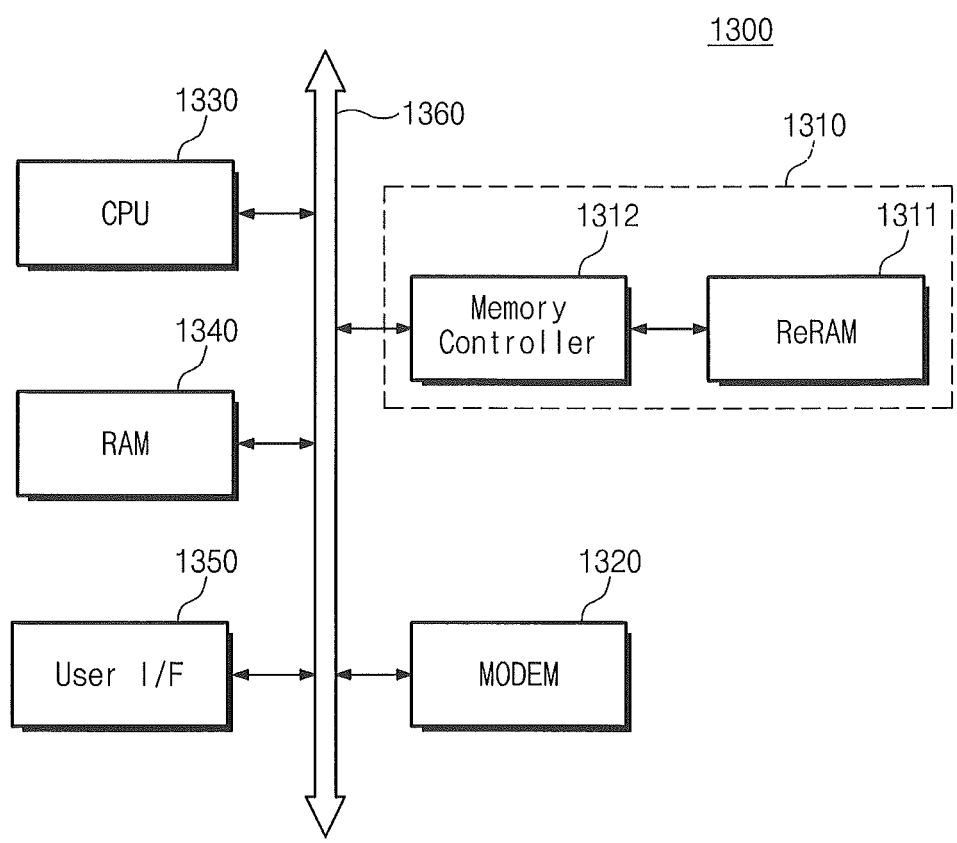
FIG. 16 is a block diagram illustrating an information processing system including a resistive memory device according to some embodiments of the inventive concept.

FIG. 16 is a block diagram illustrating an information processing system including a resistive memory device according to some embodiments of the inventive concept. Referring to FIG. 16, an information processing system 1300 may include a memory system 1310 which has a resistive memory device 1311 according to some embodiments of the present inventive concept. The information processing system 1300 may include a mobile device or a computer. For example, the information processing system 1300 may include the memory system 1310, a MODEM 1320, a CPU 1330, a RAM 1340, and a user interface 1350 which are electrically connected with a system bus 1360. Data processed by the CPU 1330 or data input from an external device may be stored at the memory system 1310. The information processing system 1300 may further comprise a solid state disk, a camera image sensor, an application chipset, and so on. For example, the memory system 1310 may be formed of a solid state drive (SSD). In this case, the information processing system 1300 may store mass data at the memory system 1310 stably and reliably.

An operating voltage set at a write or read operation may be applied to a selected memory cell of the resistive memory device 1311, which constitutes the memory system 1310 together with a memory controller 1312, within a line delay period of time. Thus, an abnormal operation due to the interference between a selected memory cell and peripheral memory cells may be reduced, so that the performance of the information processing system is improved. Also, a memory cell array of the resistive memory device 1311 may have a cross-point structure suitable for a large-volume information processing system.

Figure 17:
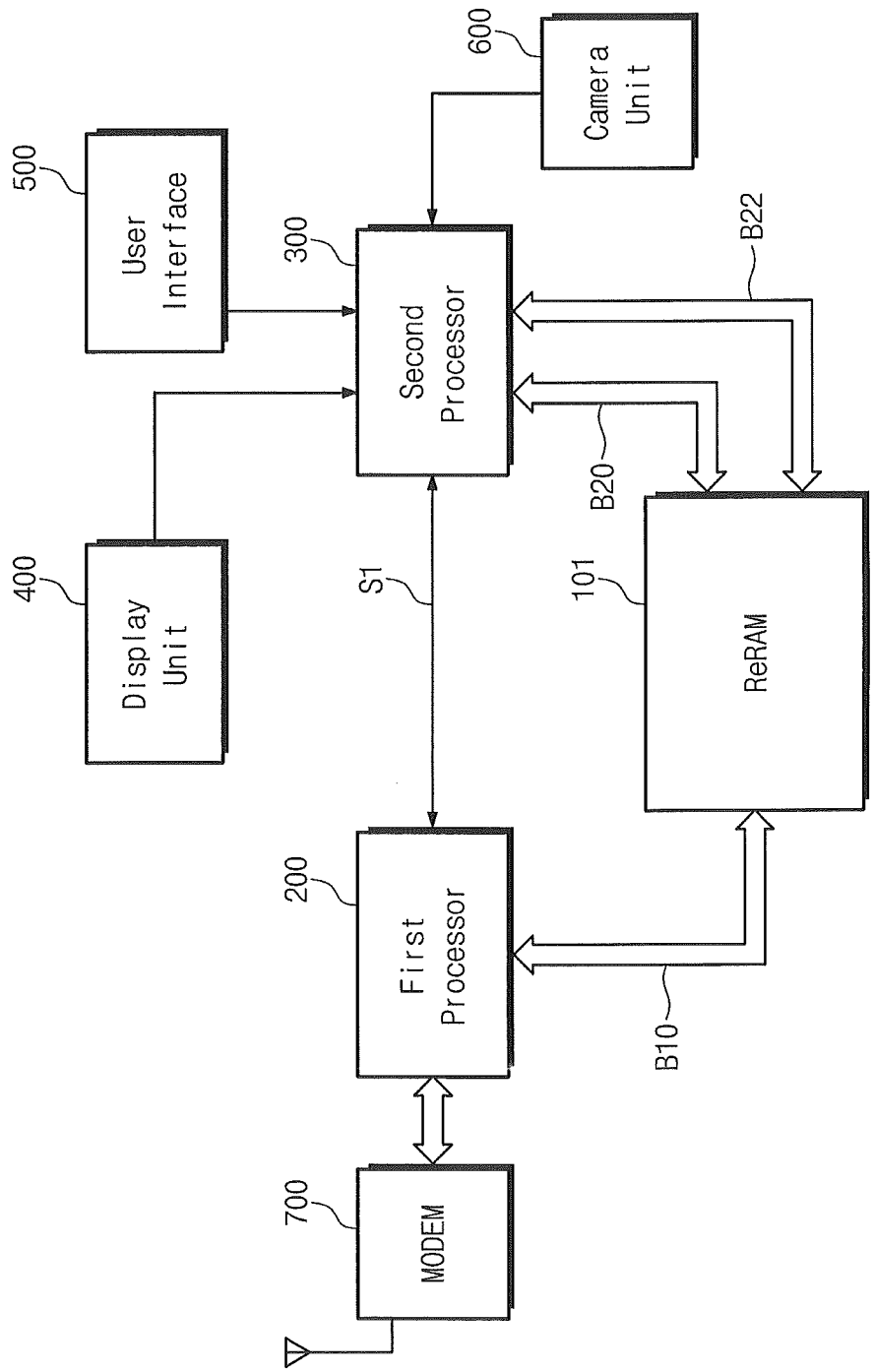
FIG. 17 is a block diagram illustrating a mobile device including a resistive memory device according to some embodiments of the inventive concept.

FIG. 17 is a block diagram illustrating a mobile device including a resistive memory device according to some embodiments of the inventive concept. Referring to FIG. 17, a mobile device may include a resistive memory device (ReRAM) 101, a first processor 200, a second processor 300, a display unit 400, a user interface 500, a camera unit 600, and a modem 700.

A first port of the ReRAM 101 may be connected to the first processor 200 being a baseband processor through a first bus B10, and a second port thereof may be connected to a second processor 300 being an application processor through a second bus B20. Also, a third port of the ReRAM 101 may be connected to the second processor 300 through a third bus B22.

An interface of the first bus B10 may be a DRAM interface, and the first port may receive first packet data DQ1/ADDR1/CMD1 generated from the first processor 200 to transfer it to an internal circuit block of the ReRAM 101. Also, the first port may provide first data of the ReRAM 101 to the first processor 200. In this case, the first data may be parallel data.

An interface of the third bus B22 may be a DRAM interface, and the third port may receive third packet data DQ3/ADDR3/CMD3 generated from the second processor 300 to transfer it to an internal circuit block of the ReRAM 101. Also, the third port may provide third data of the ReRAM to the second processor 300. In this case, the first data may be serial data or parallel data. A clock generator may generate a first internal clock signal ICLK1 and a third internal clock signal ICLK3 based on an external clock signal CLK. In this case, a frequency of the first internal clock signal ICLK1 may be different from that of the third internal clock signal ICLK3.

According to some embodiments of the present inventive concept, the first and second processors 200 and 300 and the ReRAM 101 may be integrated to a chip or packaged. In this case, the ReRAM 101 may be embedded in the mobile device.

The ReRAM 101 may be connected in common to the first and second processors 200 and 300. Thus, one ReRAM 101 may be used as a memory device which replaces a plurality of storage memories and a plurality of DRAMs.

The ReRAM 101 of FIG. 17 may include three ports and different interfaces to perform roles of a DRAM and a flash memory.

An operating voltage set at a write or read operation may be applied to a selected memory cell of the ReRAM 101 within a line delay period of time. Thus, an abnormal operation due to the interference between a selected memory cell and peripheral memory cells may be reduced, so that the performance of the mobile device is improved.

Also, since a memory device is used as a plurality of DRAMs and a flash memory, a system size may be scaled down, so that a cost necessary to implement the system is reduced. In addition, since it is used without change of interconnection of existing processors, the compatibility may be bettered.

In the event that the mobile device is a handheld communications device, the first processor 200 may be connected with the modem 700 which transmits and receives communications data and modulates and demodulates data.

A NOR or NAND flash memory may be additionally connected to the first processor 200 or the second processor 300 to store mass information.

The display unit 400 may have a liquid crystal having a backlight, a liquid crystal having an LED light source, or a touch screen (e.g., OLED). The display unit 400 may be an output device for displaying images (e.g., characters, numbers, pictures, etc.) in color.

There is described an example in which the mobile device is a mobile communications device. In some cases, the mobile device may be used as a smart card by adding or removing components.

The mobile device may be connected with an external communications device through a separate interface. The communications device may be a DVD player, a computer, a set top box (STB), a game machine, a digital camcorder, or the like.

The camera unit 600 may include a camera image processor (CIS), and may be connected with the second processor 300.

The mobile device may further include an application chipset, a camera image processor (CIS), a mobile DRAM, and so on.

The ReRAM 101 may be mounted independently or using various packages. For example, a chip may be packed by a package such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

Though FIG. 17 illustrates that an ReRAM 101 is installed at the mobile device, a variety of nonvolatile memories, however, may be used instead of the ReRAM 101. The nonvolatile memory may store various types of data information such as texts, graphics, software codes, and so on.

The nonvolatile memory device may be EEPROM (Electrically Erasable Programmable Read-Only Memory), STT-MRAM (Spin-Transfer Torque MRAM), CBRAM (Conductive bridging RAM), FeRAM (Ferroelectric RAM), PRAM (Phase change RAM) called OUM (Ovonic Unified Memory), RRAM or ReRAM (Resistive RAM), nanotube RRAM, PoRAM (Polymer RAM), NFGM (Nano Floating Gate Memory), holographic memory, molecular electronics memory device), or insulator resistance change memory.

Figure 18:
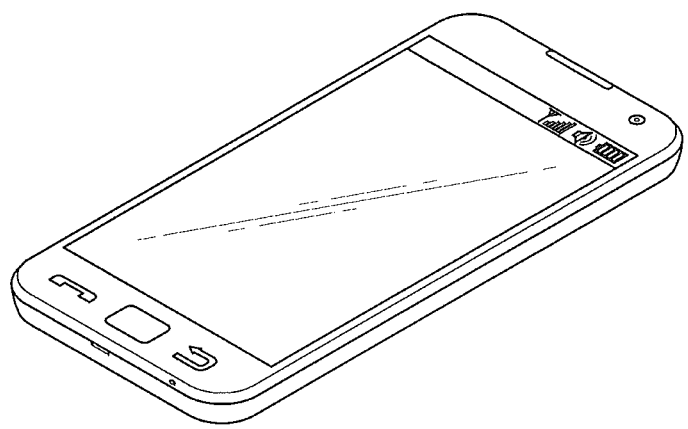
FIG. 18 is a diagram illustrating a cellular phone including a resistive memory device according to some embodiments of the inventive concept.

FIG. 18 is a diagram illustrating a cellular phone including a resistive memory device according to some embodiments of the inventive concept.

Referring to FIG. 18, a cellular phone 2000 may include a semiconductor memory device 100 of FIG. 1, so that a DRAM and a small-capacity flash memory may not be necessary. In case of the cellular phone 2000, the semiconductor memory device 100 may have such an operating manner that an operating voltage set at a mode of operation is applied within a line delay period of time. Thus, an abnormal operation due to the interference between a selected memory cell and peripheral memory cells may be reduced, so that the performance of the cellular phone is improved. Also, since a memory device is used as a plurality of DRAMs and a flash memory, a phone size may be scaled down, so that a cost necessary to implement the cellular phone is reduced.

Figure 19:
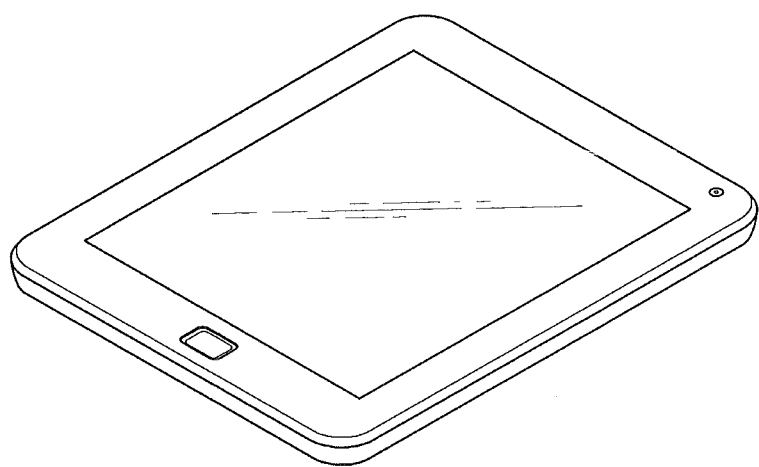
FIG. 19 is a diagram illustrating a tablet PC including a resistive memory device according to some embodiments of the inventive concept.

FIG. 19 is a diagram illustrating an application of the inventive concept applied to a tablet PC.

Referring to FIG. 19, a tablet PC 3000 may include a semiconductor memory device 100 of FIG. 1, so that a DRAM and a small-capacity flash memory may not be necessary. Thus, in case of the tablet PC 3000, the semiconductor memory device 100 may have such an operating manner that an operating voltage set at a mode of operation is applied within a line delay period of time. Thus, an abnormal operation due to the interference between a selected memory cell and peripheral memory cells may be reduced, so that write or read errors are minimized or reduced. This may mean that the performance of the tablet PC 3000 is improved. Also, since a memory device is used as a plurality of DRAMs and a flash memory, a size of the tablet PC may be scaled down, so that a cost necessary to implement the tablet PC may be reduced.

Figure 20:
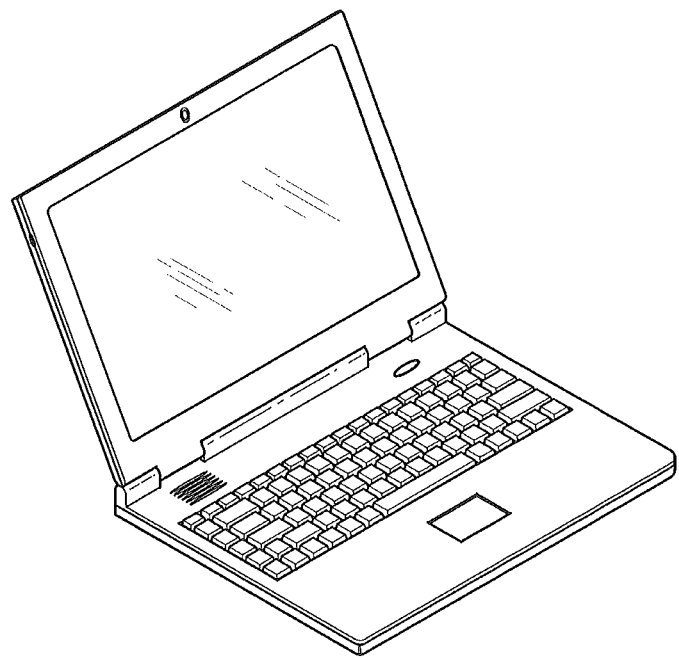
FIG. 20 is a diagram illustrating a notebook computer including a resistive memory device according to some embodiments of the inventive concept.

FIG. 20 is a diagram illustrating an application of the inventive concept applied to a notebook computer.

Referring to FIG. 20, a notebook computer 4000 may include a semiconductor memory device 100 of FIG. 1, so that a DRAM and a small-capacity flash memory may not be necessary. Thus, in case of the notebook computer 4000, the semiconductor memory device 100 may have such an operating manner that an operating voltage set at a mode of operation is applied within a line delay period of time. Thus, an abnormal operation due to the interference between a selected memory cell and peripheral memory cells may be reduced, so that the reliability of the notebook computer is improved.

Also, since a memory device is used as a plurality of DRAMs and a flash memory, a size of the notebook computer may be scaled down, so that a cost necessary to implement the notebook computer may be reduced.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A resistive memory driving method comprising:
    applying an initial voltage to a plurality of word lines and a plurality of bit lines;
    setting the plurality of word lines and the plurality of bit lines to a floating state; and
    applying an operating voltage set according to a mode of operation to a selected word line among the plurality of word lines and a selected bit line among the plurality of bit lines,
    wherein applying the operating voltage set comprises applying read pulses having read voltage levels for reading operation to the selected word line and the selected bit line, and
    wherein widths of the read pulses are greater than widths of voltage pulses that are applied to the selected word line and the selected bit line for writing operation.

2. The resistive memory driving method of claim 1, wherein applying the initial voltage comprises applying a voltage of a level of a ground voltage to the plurality of word lines and the plurality of bit lines.

3. The resistive memory driving method of claim 1, wherein applying the operating voltage set further comprises applying voltage pulses to the selected word line and the selected bit line, each of the voltage pulses having a width less than or equal to a line delay period.

4. The resistive memory driving method of claim 3, wherein the line delay period comprises a product of resistance values and capacitance values of the selected word line and the selected bit line.

5. The resistive memory driving method of claim 3, wherein the line delay period comprises a time constant, which is a product of resistance and capacitance of unselected word lines among the plurality of word lines and unselected bit lines among the plurality of bit lines.

6. The resistive memory driving method of claim 3, wherein applying the voltage pulses comprises applying set pulses having set voltage levels for writing operation.

7. The resistive memory driving method of claim 3, wherein applying the voltage pulses comprises applying reset pulses having reset voltage levels for writing operation.

8. The resistive memory driving method of claim 3, wherein applying the voltage pulses comprises applying forming pulses having a forming voltage level set for forming operation.

9. A resistive memory device comprising:
    a memory cell array including word lines, bit lines and memory cells in respective ones of intersections of each of the word lines and each of the bit lines; and
    a control circuit configured to apply an initial voltage to the word lines and the bit lines and then to apply an operating voltage set according to a mode of operation to a selected word line among the word lines and a selected bit line among the bit lines within a line delay period while unselected word lines among the word lines and unselected bit lines among the bit lines being electrically floated, wherein the line delay period comprises a time constant, which is a product of resistance and capacitance of one word line among the word lines and one bit line among the bit lines.

10. The resistive memory device of claim 9, wherein the operating voltage set according to a mode of operation comprises voltage pulses, each of the voltage pulses having a width less than or equal to the line delay period.

11. The resistive memory device of claim 10, wherein the voltage pulses comprises set pulses having set voltage levels, reset pulses having reset voltage levels, or read pulses having read voltage levels.

12. The resistive memory device of claim 11, wherein widths of the read pulses are greater than widths of the set pulses or widths of the reset pulses.

13. A method of programming and reading a nonvolatile memory device comprising:
    applying a first voltage pulse to a selected word line and applying a second voltage pulse to a selected bit line to program or read a selected cell identified by the selected word line and selected bit line, wherein each of the first and second voltage pulses has a duration equal to or less than a line delay period associated with the selected word line and selected bit line, and wherein the line delay is a time constant comprising a product of a resistance and a capacitance of the selected word line and a resistance and a capacitance of the selected bit line.

14. The method of claim 13, further comprising:
    setting a plurality of word lines comprising the selected word line and a plurality of bit lines comprising the selected bit line to a floating state before applying the first and second voltage pulses; and
    maintaining unselected word lines among the plurality of word lines and unselected bit lines among the plurality of bit lines in the floating state while applying the first and second voltage pulses.

15. The method of claim 14, further comprising:
    applying a first initial voltage to the plurality of word lines and applying a second initial voltage to the plurality of bit lines before setting the plurality of word lines and the plurality of bit lines to the floating state.

16. The method of claim 13, wherein the first voltage pulse has an amplitude equal to that of the second voltage pulse and the first voltage pulse has polarity opposite of that of the second voltage pulse.

17. The method of claim 13, wherein the first voltage pulse that is applied to read the selected cell has a first width and the first voltage pulse that is applied to program the selected cell has a second width that is less than the first width.

* * * * *